United States Patent [19]
Shigeta et al.

[11] Patent Number: 5,976,907
[45] Date of Patent: Nov. 2, 1999

[54] SOLID STATE IMAGING DEVICE AND PRODUCTION METHOD FOR THE SAME

[75] Inventors: Yoko Shigeta, Nara; Michiyo Ichikawa, Kyoto; Akira Tsukamoto, Toyonaka, all of Japan

[73] Assignee: Matsushita Electronics Corporation, Osaka, Japan

[21] Appl. No.: 09/005,048

[22] Filed: Jan. 9, 1998

Related U.S. Application Data

[62] Division of application No. 08/640,050, Apr. 30, 1996, Pat. No. 5,739,548.

[51] Int. Cl.⁶ .......................... H01L 31/036; H01L 79/04
[52] U.S. Cl. .................................. 438/65; 257/59; 438/70
[58] Field of Search ........................... 438/65, 70; 257/59

[56] References Cited

U.S. PATENT DOCUMENTS

| | | | |
|---|---|---|---|
| 5,132,251 | 7/1992 | Kim et al. | 438/70 |
| 5,250,798 | 10/1993 | Iizuka et al. | 250/208.1 |
| 5,466,926 | 11/1995 | Sasano et al. | 250/216 |

FOREIGN PATENT DOCUMENTS

| | | |
|---|---|---|
| 0 511 404 | 11/1992 | European Pat. Off. . |
| 0 573 219 | 12/1993 | European Pat. Off. . |
| 3 276677 | 12/1991 | Japan . |
| 4 074470 | 3/1992 | Japan . |
| 5 206429 | 8/1993 | Japan . |
| 5 251674 | 9/1993 | Japan . |

*Primary Examiner*—Olik Chaudhuri
*Assistant Examiner*—William David Coleman
*Attorney, Agent, or Firm*—McDermott, Will & Emery

[57] ABSTRACT

The invention provides a solid state imaging device with high photosensitivity. A lens resin coated on the surface of the device is subjected to an exposing treatment using lens masks and a developing treatment, thereby forming lens patterns. After improving the light transmittance of the lens patterns through irradiation of UV, the lens patterns are heated so as to form micro lenses each in the shape of a hemisphere. At this point, the heating temperature is set at a temperature lower than a temperature at which the lens patterns are completely melted. As a result, the lens patterns are prevented from flowing out, and a distance between the adjacent micro lenses becomes equal to a distance between the adjacent lens patterns. Accordingly, by making small the distance between the adjacent lens patterns, the light receiving area of each micro lens can be enlarged.

11 Claims, 8 Drawing Sheets

SOLID STATE IMAGING DEVICE AND PRODUCTION METHOD FOR THE SAME

This is a divisional of application Ser. No. 08/640,050, filed Apr. 30, 1996 now U.S. Pat. No. 5,739,548.

BACKGROUND OF THE INVENTION

The present invention relates to a solid state imaging device and a production method for the same.

In the recent trend toward a compact solid state imaging device, there arises a problem of decreased photosensitivity of the solid state imaging device because the area of a light receiving portion is reduced as the device becomes compact. As a countermeasure against this problem, a solid state imaging device comprising a micro lens for collecting light on the light receiving portion has already been realized. The technique for forming a micro lens is indispensable in the production of a solid state imaging device at present.

Now, a conventional solid state imaging device will be described.

FIG. 8 is a sectional view for showing an exemplified configuration of the conventional solid state imaging device. In FIG. 8, a reference numeral 11 denotes a semiconductor substrate, a reference numeral 12 denotes photodiodes formed on the surface of the semiconductor substrate 11 so as to convert incident light into a charge, a reference numeral 13 denotes a first flattening layer for flattening the surface of the semiconductor substrate 11, a reference numeral 14 denotes a color filter formed on the flattening layer 13, a reference numeral 15 denotes a second flattening layer for flattening the level difference on the color filter 14, and a reference numeral 50 denotes micro lenses formed on the second flattening layer 15 so as to collect light on the corresponding photodiodes 12.

The first flattening layer 13 is formed by coating the semiconductor substrate 11 with a transparent film material in a desired thickness. The color filter 14 is formed by, for example, photolithography so as to correspond to the respective photodiodes 12. The second flattening layer 15 is formed by coating the color filter 14 with a transparent film material in a desired thickness.

Each of the micro lenses 50 is made of a phenol resin or the like, and is formed above the corresponding photodiode 12 in the shape of a hemisphere. The micro lens 50 has an appropriate height so that light entering the surface thereof can be efficiently collected on the corresponding photodiode 12.

The hemispherical shape of the micro lens 50 is formed through the following procedures: First, a lens resin is coated on the second flattening layer 15. Then, the lens resin is subjected to an exposing treatment using a lens mask and further to a developing treatment, thereby patterning the lens resin so as to be located in the position above each of the photodiodes 12. Then, the patterned photo resist is heated so as to be melted, thereby forming the hemispherical shape of the micro lens 50 by making use of the surface tension.

FIG. 9 is a plan view of the conventional solid state imaging device taking from the upward direction, wherein a reference numeral 50 denotes micro lenses, and reference letters x and y indicate a space between the adjacent micro lenses at the center and a space therebetween at the end, respectively.

FIG. 10 is a sectional view for showing another exemplified configuration of the conventional solid state imaging device. In FIG. 10, a reference numeral 11 denotes a semiconductor substrate, a reference numeral 12 denotes photodiodes, a reference numeral 13 denotes a first flattening layer, a reference numeral 14 denotes a color filter, and a reference numeral 15 denotes a second flattening layer, all of which are similar to those shown in FIG. 8. This solid state imaging device is different from that shown in FIG. 8 in an interlayer insulating film 16 formed between the semiconductor substrate 11 and the first flattening layer 13. The interlayer insulating film 16 has a smooth surface but has irregularity in accordance with the irregularity on the semiconductor substrate 11. The first flattening layer 13 is formed in order to flatten the irregularity on the surface of the interlayer insulating film 16.

However, the aforementioned solid state imaging devices and the production methods for the devices have the following problems:

In the solid state imaging device of FIG. 8, for the purpose of further improvement of the photosensitivity, it is desired to make a space S between the adjacent micro lenses 50 as small as possible so as to enlarge the light receiving area of each micro lens 50.

In the conventional production method, however, when the micro lenses 50 are formed by heating the patterned lens resin (hereinafter referred to as the lens patterns), the heating temperature is set at a temperature where the lens patterns are completely melted. Therefore, the melted lens patterns are forced out of the bottoms of the intended patterns.

Accordingly, as is shown in FIG. 9, the space x at the center between the adjacent micro lenses 50 is smaller than the space y at the end. As a result, even when the space x at the center is extremely minimized, the space y at the end cannot be extremely minimized. In this manner, there is a limit in enlarging the light receiving area of each micro lens 50.

Furthermore, in the case where the space between the adjacent lens patterns is too small, the adjacent lens patterns which have been forced out of the intended patterns due to the thermal dissolution come in contact with each other, and eventually the lens patterns flow out. This spoils the shape of each micro lens 50, resulting in a smaller surface area of the hemisphere portion as well as a smaller height. As a result, the light quantity collected on each photodiode 12 is decreased, so that the photosensitivity of the device is degraded.

Additionally, in accordance with the study by the present inventors, it has been found that higher photosensitivity can be attained by allowing each micro lens to have a larger height and minimizing a distance between the micro lens and a light receiving portion in the case where the light receiving portion has a small area.

However, since the lens patterns are completely melted in the conventional methods, it is impossible, due to the surface tension, to make the height H of the micro lens 50 larger than a half R of the bottom width of the micro lens 50 in the alignment direction of the light receiving portions. Accordingly, when a distance between the micro lens 50 and the photodiode 12 is small, it is feared that the micro lens 50 cannot be formed into an optimal shape for collecting the light.

Furthermore, when the interlayer insulating film 16 is formed on the semiconductor substrate 11 as in the solid state imaging device of FIG. 10, a distance between the micro lens 50 and the photodiode 12 is enlarged by the thickness of the interlayer insulating film 16. Therefore, even when the micro lens 50 has an optimal shape, there is the possibility of incident light not being collected on the photodiode 12 owing to the effects of scattering and the like. In particular when the refractive index of the interlayer insulating film 16 is larger than those of the first flattening layer 13 and the color filter 14, such a phenomenon becomes conspicuous, resulting in degrading the photosensitivity of the device.

SUMMARY OF THE INVENTION

One object of this invention is providing a solid state imaging device having higher photosensitivity than a conventional device. Another object of the invention is attaining high photosensitivity by suppressing the decrease thereof even in a solid state imaging device comprising an interlayer insulating film formed on a semiconductor substrate.

For the purpose of achieving the aforementioned objects, a heating temperature in the formation of micro lenses in this invention is set at a temperature lower than a temperature at which a lens resin is completely melted. As a result, not only each micro lens can be securely formed in the shape of a hemisphere but also the surface area thereof can be enlarged.

Alternatively, the lens resin is coated in a large thickness, and the heating temperature in the formation of the micro lenses is set at a temperature lower than a temperature at which the lens resin is completely melted. As a result, each the formed micro lenses has a larger dimension in the longitudinal direction. When the dimension of the micro lens is larger in the longitudinal direction, a distance between the micro lens and the corresponding light receiving portion can be made small, so as to collect incident light on the light receiving portion.

Furthermore, by forming a flattening layer on an interlayer insulating film out of a material having a larger refractive index than that of the interlayer insulating film, a pseudo-convex lens for collecting light on the light receiving portion can be formed. Moreover, a material which is melted into a liquid state through a heat treatment is used for the flattening layer and a heat treatment is conducted in one of the production procedures for the device. As a result, the flattening layer can be formed in a very small thickness, so that the distance between the micro lens and the light receiving portion can be made small.

DETAILED DESCRIPTION OF THE INVENTION (Embodiment 1)

Figure 1:
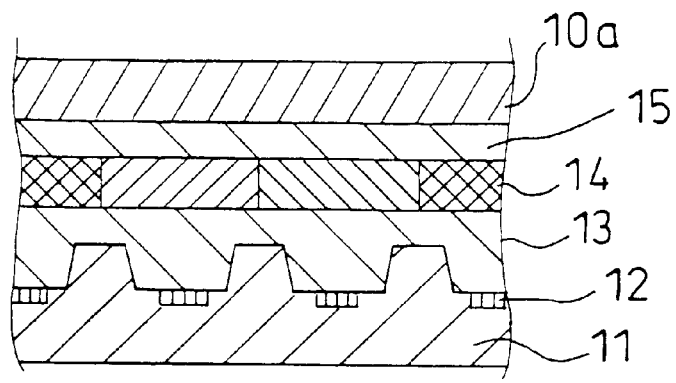
FIGS. 1(*a*) through 1(*d*) are diagrams for showing the production procedures for micro lenses in a production method for a solid state imaging device according to a first embodiment of the invention, wherein FIGS. 1(*a*) through 1(*d*) are sectional views of the solid state imaging device in the respective procedures.
Figure 1:
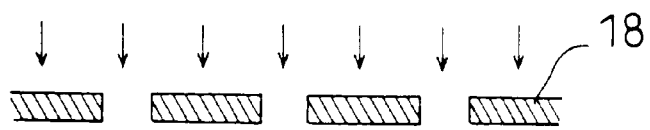
Figure 1:
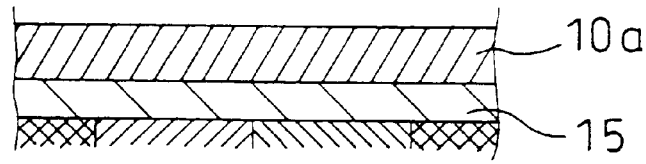
Figure 1:
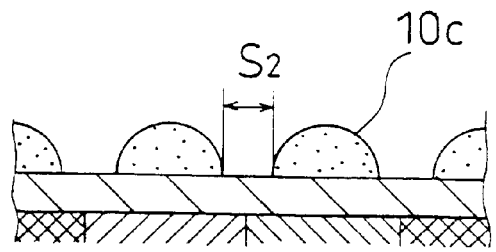

FIGS. 1(*a*) through 1(*d*) show the production procedures for micro lenses in a production method for a solid state imaging device according to the first embodiment of the invention, wherein FIGS. 1(*a*) through 1(*d*) are sectional views of the solid state imaging device in the respective procedures.

In FIG. 1(*a*), a reference numeral 11 denotes a semiconductor substrate, a reference numeral 12 denotes photodiodes formed as light receiving portions on the surface of the semiconductor substrate 11 so as to convert incident light into a charge, a reference numeral 13 denotes a first flattening layer for flattening the surface of the semiconductor substrate 11, a reference numeral 14 denotes a color filter formed by, for example, the photolithography on the first flattening layer 13, and a reference numeral 15 denotes a second flattening layer for flattening the level difference on the color filter 14. In FIGS. 1(*b*) through 1(*d*), the semiconductor substrate 11, the photodiodes 12, the first flattening layer 13 and the color filter 14 are omitted.

First, as is shown in FIG. 1(*a*), the surface of the second flattening layer 15 is coated with a lens resin 10*a* made of a thermoplastic resin such as phenol resins. The lens resin 10*a* can be deformed by heat and has a refractive index of 1.3 or more.

Next, as is shown in FIG. 1(*b*), lens masks 18 are disposed above the lens resin 10*a*. The lens masks 18 are arranged with pitches in accordance with the positions of the photodiodes 12.

An exposing treatment is conducted by using the lens masks 18 and a development treatment is further conducted, thereby forming lens patterns 10*b* as shown in FIG. 1(*c*). Furthermore, the lens patterns 10*b* are irradiated with UV in order to improve the light transmittance. In this manner, a photosensitive agent included in the lens patterns 10*b* is decomposed, so that the lens patterns 10*b* become transparent.

Then, a heat treatment is conducted, so as to form micro lenses 10*c* as shown in FIG. 1(*d*). The heating temperature in the heat treatment is 130° C. through 140° C. When the lens patterns 10*b* are heated to a temperature of 120° C. through 130° C., the lens patterns 10*b* start to be melted, and when they are heated to a temperature of 150° C. through 160° C., they are completely melted. By setting the heating temperature within the range between 130° C. and 140° C., which is lower by 10° C. through 20° C. than the temperature at which the lens patterns are completely melted, the lens patterns 10*b* are prevented from being forced out of the bottoms of the intended patterns. As a result, the adjacent lens patterns are prevented from coming in contact with each other and flowing out, and the shape of the resultant micro lens 10c is prevented from being spoiled. In other words, each of the micro lenses 10c can be securely formed in the shape of a hemisphere and in a sufficient height.

Furthermore, a space $S_2$ between the adjacent micro lenses 10c is equal to a space $S_1$ between the adjacent lens patterns 10b. Accordingly, by bringing the space $S_1$ between the lens patterns 10b close to zero, the space $S_2$ between the micro lenses 10c can be accordingly brought close to zero, namely the surface area of each micro lens 10c can be enlarged.

In this manner, by setting the heating temperature for the formation of the micro lenses 10c at the temperature at which the lens patterns 10b are not completely melted, it is possible to form the micro lenses 10c which can efficiently collect incident light on the corresponding photodiodes 12. Furthermore, by controlling the heating temperature within the range between 130° C. and 140° C., the shape of each micro lens 10c can be controlled.

Figure 2:
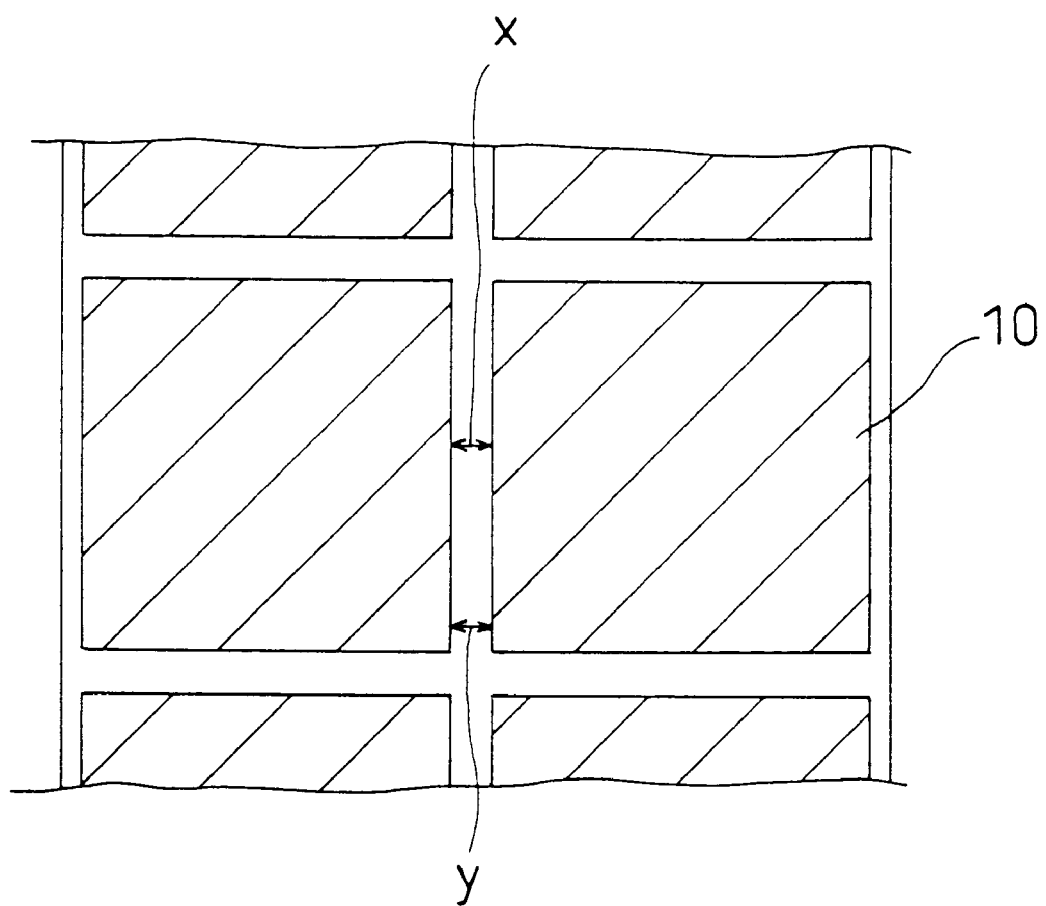
FIG. 2 is a plan view taking from the upward direction of the solid state imaging device produced by the production method of the first embodiment.

FIG. 2 is a plan view taking from the upward direction of the solid state imaging device produced by the production method shown in FIG. 1. In FIG. 2, a reference numeral 10 denotes micro lenses, and reference letters x and y indicate a space between the adjacent micro lenses 10 at the center and a space therebetween at the end, respectively.

When the heating temperature is 130° C. through 140° C., the lens patterns 10b are not completely melted, and hence, the space x at the center is equal to the space y at the end. Therefore, since both the space x at the center and the space y at the end can be minimized, the light receiving area of each micro lens 10 can be enlarged as compared with that in the conventional device.

(Embodiment 2)

FIGS. 3(a) through 3(d) show the production procedures for micro lenses in a production method for a solid state imaging device according to the second embodiment of the invention, wherein the FIGS. 3(a) through 3(d) are sectional views of the solid state imaging device in the respective procedures.

Figure 3A:
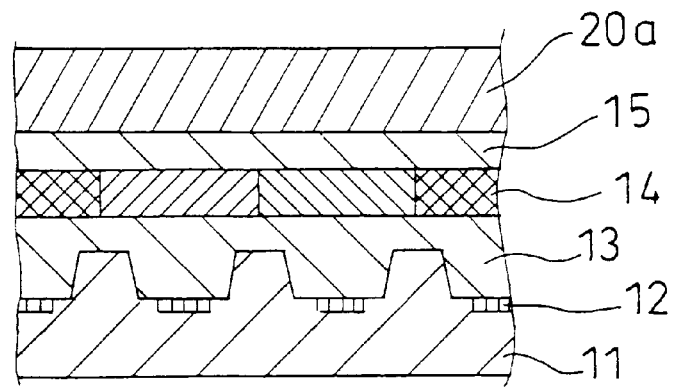
FIGS. 3(*a*) through 3(*d*) are diagrams for showing the production procedures for micro lenses in a production method for a solid state imaging device according to a second embodiment of the invention, wherein FIGS. 3(*a*) through 3(*d*) are sectional views of the solid state imaging device in the respective procedures.
Figure 3B:
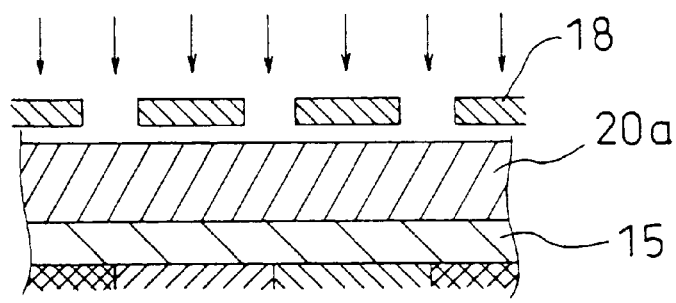
Figure 3C:
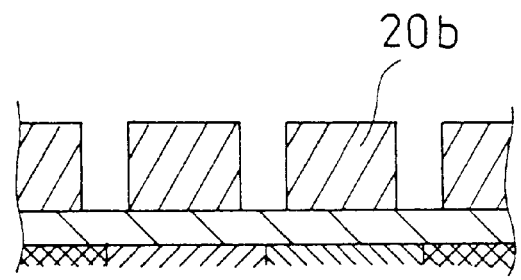
Figure 3D:
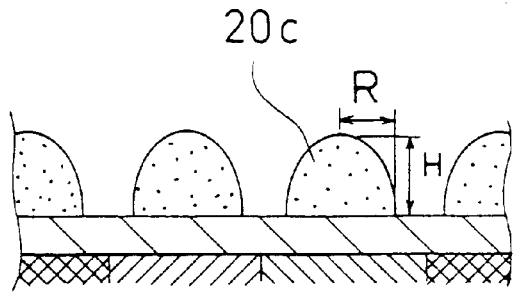

In FIG. 3(a), a reference numeral 11 denotes a semiconductor substrate, a reference numeral 12 denotes photodiodes formed as light receiving portions, a reference numeral 13 denotes a first flattening layer, a reference numeral 14 denotes a color filter, and a reference numeral 15 denotes a second flattening layer, all of which are similar to those shown in FIG. 1(a). In FIGS. 3(b) through 3(d), the semiconductor substrate 11, the photodiodes 12, the first flattening layer 13 and the color filter 14 are omitted.

This embodiment is different from the first embodiment in a larger thickness of a lens resin 20a.

First, as is shown in FIG. 3(a), the surface of the second flattening layer 15 is coated with the lens resin 20a made of a thermoplastic resin in a thickness of 2 through 4 μm.

Then, as is shown in FIG. 3(b), lens masks 18 are disposed above the lens resin 20a. The lens masks 18 are arranged with pitches in accordance with the positions of the photodiodes 12.

An exposing treatment is conducted by using the lens masks 18 and a developing treatment is further conducted, thereby forming lens patterns 20b as shown in FIG. 3(c). Furthermore, the lens patterns 20b are irradiated with UV in order to improve the light transmittance. In this manner, a photosensitive agent included in the lens patterns 20b is decomposed, so that the lens patterns 20b become transparent.

A heat treatment is subsequently conducted, thereby forming micro lenses 20c as shown in FIG. 3(d). By setting the heating temperature in the heat treatment within a range between 130° C. and 140° C., which is lower by 10° C. through 20° C. than the temperature at which the lens patterns 20b are completely melted, the lens patterns 20b are prevented from being forced out of the bottoms in the intended patterns and flowing out. Thus, each micro lens 20c can be formed in the shape of a hemisphere and in a sufficient height.

According to the production method shown in FIGS. 3(a) through 3(d), when the device has a small cell size, the height H of each micro lens 20c is larger than a half R of the bottom width in the alignment direction of the light receiving portions. Furthermore, it is possible to prevent the shape of the micro lens 20c from being spoiled owing to the surface tension. Accordingly, the resultant micro lens has a larger longitudinal dimension.

Figure 4:
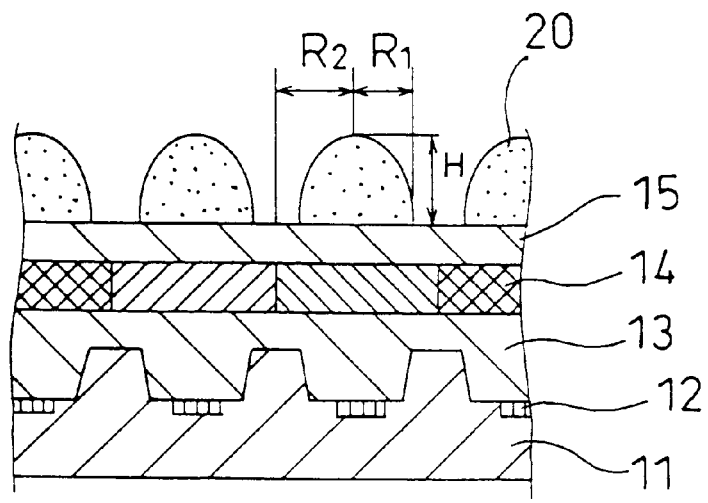
FIG. 4 is a sectional view for showing the configuration of the solid state device produced by the production method of the second embodiment.

FIG. 4 is a sectional view for showing the configuration of the solid state imaging device produced by the production method of this embodiment.

In FIG. 4, the reference numeral 11 denotes the semiconductor substrate, the reference numeral 12 denotes the photodiodes, the reference numeral 13 denotes the first flattening layer, the reference numeral 14 denotes the color filter, and the reference numeral 15 denotes the second flattening layer, all of which are identical to those shown in FIG. 3(a). A reference numeral 20 denotes micro lenses formed on the second flattening layer 15. Furthermore, a reference letter $R_1$ indicates the half of the bottom width of the micro lens 20 in the alignment direction of the light receiving portions, a reference letter $R_2$ indicates a half of the cell width in the alignment direction of the light receiving portions, and a reference letter H indicates the height of the micro lens 20. The adjacent micro lenses 20 are actually aligned with a space therebetween of 0.1 through 1.5 μm, so as not to come in contact with each other.

The shape of each micro lens 20 is a long semiellipse which can be indicated with a cycloid curve or a parabola, and the height H is larger than the half $R_1$ of the bottom width in the alignment direction of the light receiving portions. Furthermore, in this embodiment, the height H of the micro lens 20 can be made larger than the half $R_2$ of the cell width in the alignment direction of the light receiving portions. When the micro lens has a larger longitudinal dimension in this manner, the incident light can be colleted on the corresponding photodiode 12 even in a solid state imaging device in which the distance between the micro lens 20 and the photodiode 12 is small.

(Embodiment 3)

Figure 5:
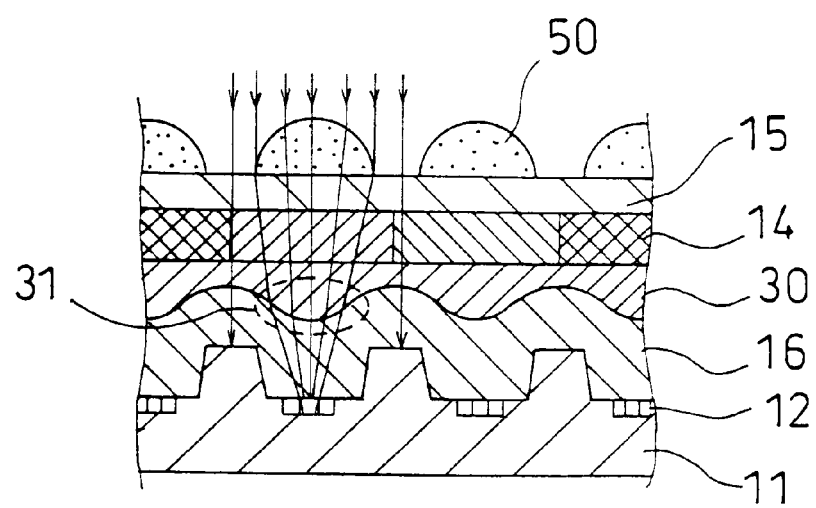
FIG. 5 is a sectional view for showing the configuration of a solid state imaging device according to a third embodiment of the invention.

FIG. 5 is a sectional view for showing the configuration of a solid state imaging device of the third embodiment of the invention. In FIG. 5, a reference numeral 11 denotes a semiconductor substrate, a reference numeral 12 denotes photodiodes formed on the surface of the semiconductor substrate as light receiving portions, a reference numeral 16 denotes an interlayer insulating film formed on the semiconductor substrate 11 as an insulating film, a reference numeral 30 denotes a first flattening layer for flattening irregularity on the surface of the interlayer insulating film 16, a reference numeral 14 denotes a color filter formed on the first flattening layer 30, a reference numeral 15 denotes a second flattening layer for flattening the level difference on the surface of the color filter 14, and a reference numeral 50 denotes micro lenses formed on the second flattening layer 15.

The first flattening layer 30 is made of a material having a larger refractive index than that of the interlayer insulating film 16. For example, the interlayer insulating film 16 and the first flattening layer 30 are formed out of any of the following combinations: a silicon oxide film and a phenol resin film; a fluorine resin film and a silicon oxide film; a fluorine resin film and an acrylic resin film; a fluorine resin film and a phenol resin film; a fluorine resin film and a polyimide resin film; a silicon oxide film and an acrylic resin film; a silicon oxide film and a polyimide resin film; and an acrylic resin film and a phenol resin film.

The interlayer insulating film 16 has a thickness of approximately 0.1 through 1.5 μm. The first flattening layer 30 formed on the interlayer insulating film 16 has a larger refractive index than those of the interlayer insulating film 16, the color filter 14 and the second flattening layer 15.

Since the first flattening layer 30 is made of the material having a larger refractive index than that of the interlayer insulating film 16, a pseudo-convex lens 31 facing downward is formed at each recessed portion of the interlayer insulating film 16. The center of the pseudo-convex lens 31 accords with the center of the corresponding photodiode 12. Owing to this pseudo-convex lens 31, light which cannot be collected on the photodiode 12 in the conventional solid state imaging device can be collected on the photodiode 12 in the present device. Even through the pseudo-convex lens 31 is thus formed, the distance between the micro lens 50 and the corresponding photodiode 12 is not changed, and hence, the micro lens 50 can attain the light collecting effect to the same extent as in the conventional device.

The curvature and the depth of the pseudo-convex lens 31 can be varied by changing the thickness of the interlayer insulating film 16. By optimizing the shapes of the micro lens 50 and the pseudo-convex lens 31, the distance between the micro lens 50 and the photodiode 12 and that between the pseudo-convex lens 31 and the photodiode 12, the resultant solid state imaging device can achieve high photosensitivity regardless of the shape of each photodiode 12.

Furthermore, the combination of this embodiment with the first or second embodiment can further increase the photosensitivity of the solid state imaging device.

It is noted that this embodiment is applicable not only to a color solid state imaging device including a color filter but also to a black-and-white solid state imaging device including no color filter.

(Embodiment 4)

Figure 6:
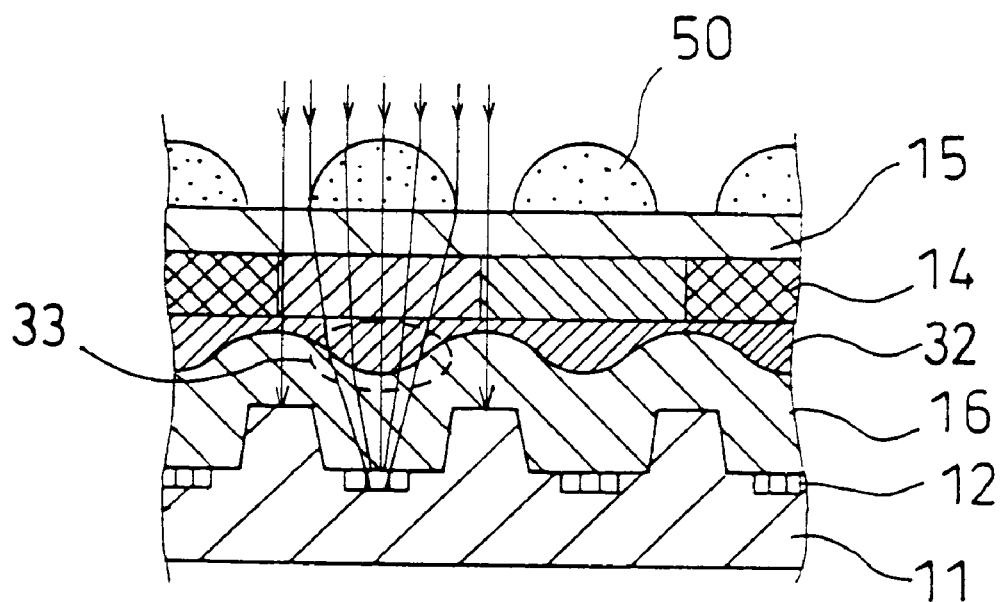
FIG. 6 is a sectional view for showing the configuration of a solid state imaging device according to a fourth embodiment of the invention.

FIG. 6 is a sectional view for showing the configuration of a solid state imaging device of the fourth embodiment of the invention. In FIG. 6, a reference numeral 11 denotes a semiconductor substrate, a reference numeral 12 denotes a photodiodes formed on the surface of the semiconductor substrate as a light receiving portions, a reference numeral 16 denotes an interlayer insulating film formed on the semiconductor substrate 11 as an insulating film, a reference numeral 32 denotes a first flattening layer for flattening irregularity on the surface of the interlayer insulating film 16, a reference numeral 14 denotes a color filter formed on the first flattening layer 32, a reference numeral 15 denotes a second flattening layer for flattening the level difference on the surface of the color filter 14, and a reference numeral 50 denotes micro lenses formed on the second flattening layer 15.

The interlayer insulating film 16 is made of a fluorine resin film, a silicon oxide film or an acrylic resin film, and has a thickness of approximately 0.1 through 1.5 μm. The first flattening layer 32 formed on the interlayer insulating film 16 is made of a thermoplastic resin such as phenol resins, and has a larger refractive index than those of the interlayer insulating film 16, the color filter 14 and the second flattening layer 15.

Since the first flattening layer 32 is made of the material having a larger refractive index than that of the interlayer insulating film 16, a pseudo-convex lens 33 facing downward is formed in each recessed portion of the interlayer insulating film 16. The center of the pseudo-convex lens 33 accords with the center of the corresponding photodiode 12. Owing to this pseudo-convex lens 33, light which cannot be collected on the photodiode in the conventional solid state imaging device can be collected on the photodiode 12 in the present solid state imaging device. Furthermore, since the first flattening layer 32 has thermoplasticity, the first flattening layer 32 can be melted into a liquid state when heated, so as to provide a very thin and completely flat film. As a result, the distance between the micro lens 50 and the corresponding photodiode 12 can be minimized. Thus, the distance between the micro lens 50 and the corresponding photodiode 12 can be optimized, thereby collecting more light on the photodiode.

The curvature and the depth of the pseudo-convex lens 33 can be varied by changing the thickness of the interlayer insulating film 16. By optimizing the shapes of the micro lens 50 and the pseudo-convex lens 33, the distance between the micro lens and the photodiode 12 and that between the pseudo-convex lens 33 and the photodiode 12, the resultant solid state imaging device can attain high photosensitivity regardless of the shape of each photodiode 12.

Figure 7A:
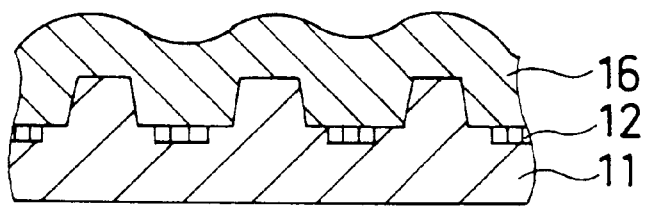
FIGS. 7(*a*) through 7(*c*) are diagrams for showing the production procedures for a flattening layer in the production method for the solid state imaging device of the fourth embodiment, wherein FIGS. 7(*a*) through 7(*c*) are sectional views of the solid state imaging device in the respective procedures.
Figure 7B:
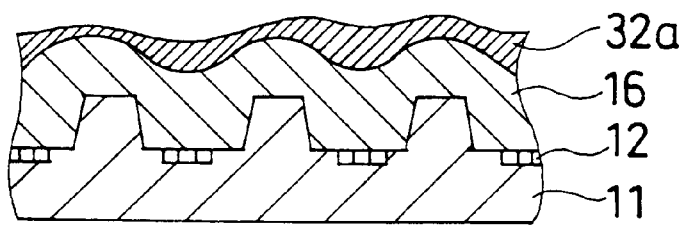
Figure 7C:
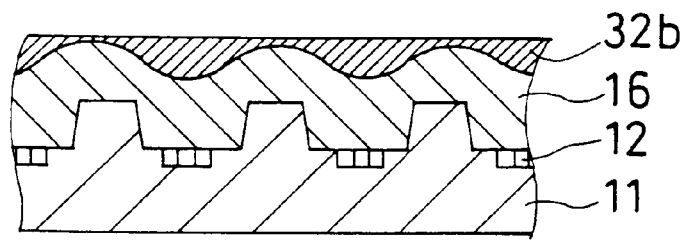
Figure 8:
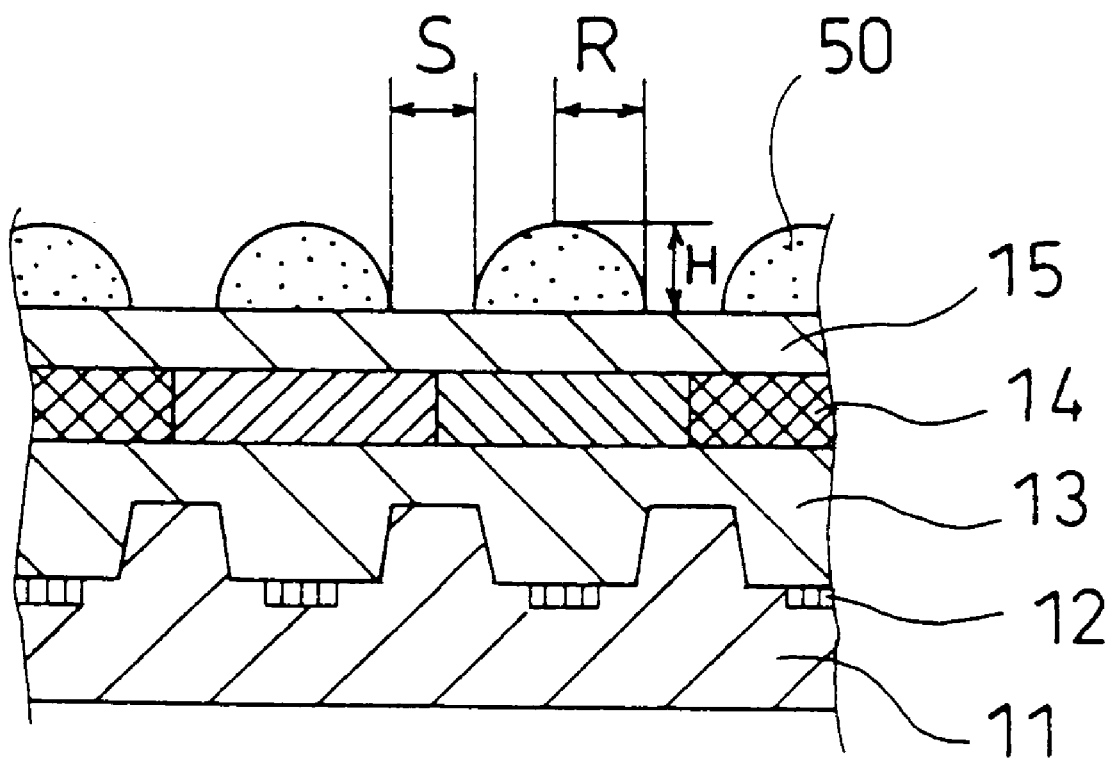
FIG. 8 is a sectional view for showing an exemplified configuration of a conventional solid state imaging device.
Figure 9:
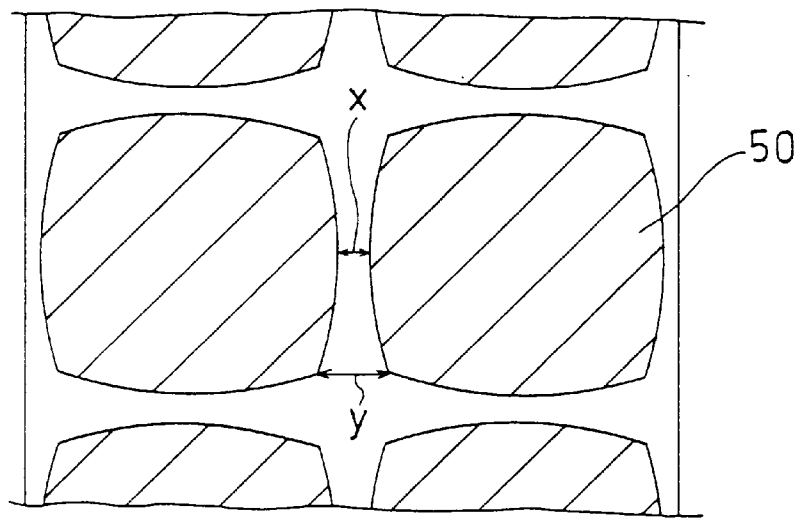
FIG. 9 is a plan view taking from the upward direction of the conventional solid state imaging device.
Figure 10:
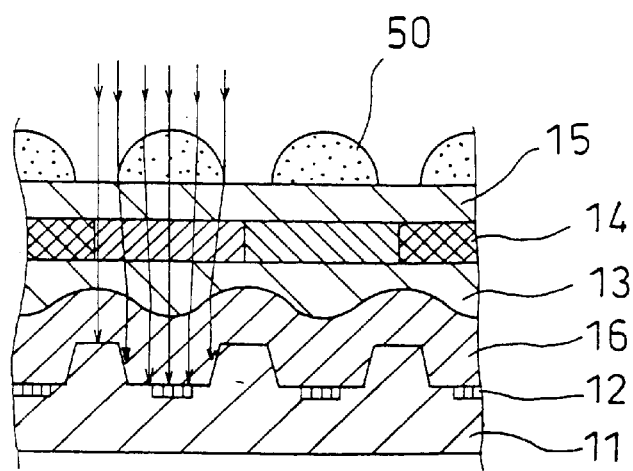
FIG. 10 is a sectional view for showing another exemplified configuration of the conventional solid state imaging device.

FIGS. 7(a) through 7(c) are diagrams for showing the production procedures for the first flattening layer in the production method for the solid state imaging device of this embodiment, wherein FIGS. 7(a) through 7(c) are sectional views of the solid state imaging device in the respective procedures. As is shown in FIG. 7(a), the interlayer insulating film 16 is formed on the semiconductor substrate 11 bearing the photodiodes 12 on its surface.

Then, as is shown in FIG. 7(b), the interlayer insulating film 16 is coated with a first flattening resist 32a of a thermoplastic resin such as phenol resins. At this point, merely the coating process does not provide the first flattening resist 32a with a flat surface. Then, as is shown in FIG. 7(c), the first flattening resist 32a is heated to be melted into a liquid state, thereby forming a first flattening layer 32b. Through this heating process, the first flattening layer 32b having a flat surface and a small thickness can be obtained.

Furthermore, the combination of this embodiment with the first or second embodiment can further improve the photosensitivity of the solid state imaging device.

It is noted that this embodiment is applicable not only to a color solid state imaging device including a color filter but also to a black-and-white solid state imaging device including no color filter.

What is claimed is:

1. A production method for a solid state imaging device comprising:

a resist coating step of coating light receiving portions formed on a semiconductor substrate with a lens resin;

a patterning step of making the lens resin into desired patterns so as to form lens patterns; and a lens forming step of forming micro lenses for collecting light on the light receiving portions by heating the lens patterns, wherein the lens forming step includes a step of forming the micro lenses at a temperature lower than a temperature at which the lens patterns are substantially completely melted.

2. The production method for a solid state imaging device of claim 1, wherein the lens forming step includes a step of forming the micro lenses so as not to change a distance between the adjacent lens patterns and a distance between the adjacent micro lenses to be formed.

3. The production method for a solid state imaging device of claim 1, wherein the resist coating step includes a step of coating the lens resin in a thickness larger than a half of a shorter side of a bottom in the shape of a rectangle of each micro lens to be formed in the lens forming step.

4. A production method for a solid state imaging device comprising:

an insulating film forming step of forming an insulating film on a semiconductor substrate, the semiconductor substrate having light receiving portions and having recesses in areas where the light receiving portions are formed; and a flattening layer forming step of forming a flattening layer on the insulating film for flattening a surface of the insulating film, wherein the flattening layer forming step includes a step of forming the flattening layer out of a material having a larger refractive index than that of the insulating film.

5. A production method for a solid state imaging device comprising:

an insulating film forming step of forming an insulating film on a semiconductor substrate, the semiconductor substrate having light receiving portions and having recesses in areas where the light receiving portions are formed;

a flattening layer forming step of forming a flattening layer on the insulating film for flattening a surface of the insulating film;

a resist coating step of coating the light receiving portions with a lens resin;

a patterning step of making the lens resin into desired patterns so as to form lens patterns; and a lens forming step of forming micro lenses for collecting light on the light receiving portions by heating the lens patterns, wherein the flattening layer forming step includes a step of forming the flattening layer out of a material having a larger refractive index than that of the insulating film, and the lens forming step includes a step of forming the micro lenses at a temperature lower than a temperature at which the lens patterns are substantially completely melted.

6. The production method for a solid state imaging device of claim 5, wherein the lens forming step includes a step of forming the micro lenses so as not to change a distance between the adjacent lens patterns and a distance between the adjacent micro lenses to be formed.

7. The production method for a solid state imaging device of claim 5, wherein the resist coating step includes a step of coating the lens resin in a thickness larger than a half of a shorter side of a bottom in the shape of a rectangle of each micro lens to be formed in the lens forming step.

8. A production method for a solid state imaging device comprising:

an insulating film forming step of forming an insulating film on a semiconductor substrate, the semiconductor substrate having light receiving portions and having recesses in areas where the light receiving portions are formed; and a flattening layer forming step of forming a flattening layer on the insulating film for flattening a surface of the insulating film, wherein the flattening layer forming step includes a step of forming the flattening layer out of a material which has a larger refractive index than that of the insulating film and is melted into a liquid state through a heat treatment, so as to melt the material by heating, thereby flattening a surface of the flattening layer.

9. A production method for a solid state imaging device comprising:

an insulating film forming step of forming an insulating film on a semiconductor substrate, the semiconductor substrate having light receiving portions and having recesses in areas where the light receiving portions are formed;

a flattening layer forming step of forming a flattening layer on the insulating film for flattening a surface of the insulating film;

a resist coating step of coating the light receiving portions with a lens resin;

a patterning step of making the lens resin into desired patterns so as to form lens patterns; and a lens forming step of forming micro lenses for collecting light on the light receiving portions by heating the lens patterns, wherein the flattening layer forming step includes a step of forming the flattening layer out of a material which has a larger refractive index than that of the insulating film and is melted into a liquid state through a heat treatment, so as to melt the material by heating, thereby flattening a surface of the flattening layer, and the lens forming step includes a step of forming the micro lenses at a temperature lower than a temperature at which the lens patterns are substantially completely melted.

10. The production method for a solid state imaging device of claim 9, wherein the lens forming step includes a step of forming the micro lenses so as not to change a distance between the adjacent lens patterns and a distance between the adjacent micro lenses to be formed.

11. The production method for a solid state imaging device of claim 9, wherein the resist coating step includes a step of coating the lens resin in a thickness larger than a half of a shorter side of a bottom in the shape of a rectangle of each micro lens to be formed in the lens forming step.

* * * * *

UNITED STATES PATENT AND TRADEMARK OFFICE
CERTIFICATE OF CORRECTION

PATENT NO. : 5,976,907
DATED : November 2, 1999
INVENTOR(S) : Shigeta et al.

It is certified that error appears in the above-identified patent and that said Letters Patent is hereby corrected as shown below:

On the cover page:

After "Related U.S. Application Data" section, insert:

--Foreign Application Priority Data

05/02/95 [JP]  Japan  7-108390--.

Signed and Sealed this

Twenty-ninth Day of August, 2000

Attest:

Attesting Officer

Q. TODD DICKINSON

Director of Patents and Trademarks